US011895833B2

(12) United States Patent
Kim et al.

(10) Patent No.: US 11,895,833 B2
(45) Date of Patent: Feb. 6, 2024

(54) SEMICONDUCTOR MEMORY DEVICE

(71) Applicant: Samsung Electronics Co., Ltd., Suwon-si (KR)

(72) Inventors: Dong Oh Kim, Daegu (KR); Gyu Hyun Kil, Hwaseong-si (KR); Jung Hoon Han, Hwaseong-si (KR); Doo San Back, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 110 days.

(21) Appl. No.: 17/406,418

(22) Filed: Aug. 19, 2021

(65) Prior Publication Data

US 2022/0173112 A1     Jun. 2, 2022

(30) Foreign Application Priority Data

Nov. 30, 2020    (KR) ........................ 10-2020-0164407

(51) Int. Cl.
    *H10B 12/00*        (2023.01)
(52) U.S. Cl.
    CPC ........... *H10B 12/50* (2023.02); *H10B 12/315* (2023.02); *H10B 12/34* (2023.02)
(58) Field of Classification Search
    CPC ......... H01L 27/10897; H01L 27/10814; H01L 27/10823; H01L 27/10873; H10B 12/34; H10B 12/50

See application file for complete search history.

(56) References Cited

U.S. PATENT DOCUMENTS

| 6,682,986 | B2 * | 1/2004 | Kim | ................. | H01L 21/76235 |
| | | | | | 438/426 |
| 7,948,028 | B2 | 5/2011 | Renn | | |

(Continued)

FOREIGN PATENT DOCUMENTS

| JP | 2010147104 A | 7/2010 |
| KR | 20110123544 A | 11/2011 |

(Continued)

*Primary Examiner* — Edward Chin
(74) *Attorney, Agent, or Firm* — Myers Bigel, P.A.

(57) ABSTRACT

A semiconductor memory device includes a substrate including a cell region, a core region, and a boundary region between the cell region and the core region, a boundary element isolation layer in the boundary region, the boundary element isolation layer being in a boundary element isolation recess and including first and second boundary liner layers extending along a profile of the boundary element isolation recess and a first gate structure on the core region and at least a part of the boundary element isolation layer, wherein the first gate structure includes a first high dielectric layer, and a first gate insulating pattern below the first high dielectric layer, with a top surface of the substrate being a base reference level, the first gate insulating pattern does not overlap a top surface of the first boundary liner layer, and wherein the first gate insulating pattern includes a first_1 gate insulating pattern between a top surface of the second boundary liner layer and a bottom surface of the first high dielectric layer, and a first_2 gate insulating pattern disposed a top surface of the core region and a bottom surface of the first high dielectric layer.

20 Claims, 14 Drawing Sheets

(56) References Cited

U.S. PATENT DOCUMENTS

| | | | | |
|---|---|---|---|---|
| 8,759,183 B2* | 6/2014 | Heo | ................ | H01L 21/823456 |
| | | | | 257/E21.409 |
| 2014/0167177 A1* | 6/2014 | Kim | ...................... | H10B 10/12 |
| | | | | 257/369 |
| 2015/0340281 A1* | 11/2015 | Lee | .................. | H01L 21/76895 |
| | | | | 438/618 |
| 2018/0190665 A1* | 7/2018 | Huang | .................... | H10B 12/50 |
| 2019/0252393 A1* | 8/2019 | Jung | ................. | H10B 12/0385 |
| 2019/0326278 A1* | 10/2019 | Lee | ................ | H01L 21/823807 |
| 2020/0295013 A1* | 9/2020 | Jung | .................... | H01L 29/1029 |
| 2020/0381439 A1* | 12/2020 | Ikeda | .................. | H10B 12/482 |

FOREIGN PATENT DOCUMENTS

| | | |
|---|---|---|
| KR | 20120107762 A | 10/2012 |
| KR | 20140083736 A | 7/2014 |
| KR | 20150088634 A | 8/2015 |
| KR | 20180049337 A | 5/2018 |
| KR | 20190123559 A | 11/2019 |
| KR | 102054834 B1 | 12/2019 |

* cited by examiner

SEMICONDUCTOR MEMORY DEVICE

CROSS-REFERENCE TO RELATED APPLICATION

This application claims priority from Korean Patent Application No. 10-2020-0164407 filed on Nov. 30, 2020 in the Korean Intellectual Property Office, and all the benefits accruing therefrom under 35 U.S.C. 119, the contents of which in its entirety are hereby incorporated herein by reference.

BACKGROUND

1. Technical Field

The present disclosure relates to a semiconductor memory device.

2. Description of the Related Art

A semiconductor memory device, such as a DRAM, has a cell region and a core region. In particular, the core region includes a region in which a PMOS transistor is formed and a region in which an NMOS transistor is formed. Recently, a structure in which a p-type gate is provided in the region in which a PMOS transistor is formed, and an n-type gate is provided in the region in which an NMOS transistor is formed has been used.

In addition, as the integration density of a semiconductor memory device increases, it has been found that a leakage current through a gate dielectric layer of the transistor has increased. Accordingly, the gate dielectric layer may be formed using a high-k dielectric material.

SUMMARY

Embodiments of the present disclosure provide a semiconductor memory device with improved performance and reliability.

However, embodiments of the present disclosure are not restricted to the ones set forth herein. Embodiments of the present disclosure will become more apparent to one of ordinary skill in the art to which the present disclosure pertains by referencing the detailed description of the present disclosure given below.

According to an embodiment of the inventive concept, there is provided a semiconductor memory device comprising, a substrate including a cell region, a core region, and a boundary region between the cell region and the core region, a boundary element isolation layer in the boundary region, the boundary element isolation layer being in a boundary element isolation recess and including first and second boundary liner layers extending along a profile of the boundary element isolation recess and a first gate structure on the core region and at least a part of the boundary element isolation layer, wherein the first gate structure includes a first high dielectric layer, and a first gate insulating pattern below the first high dielectric layer, with a top surface of the substrate being a base reference level, to the first gate insulating pattern does not overlap a top surface of the first boundary liner layer in a direction perpendicular to the top surface of the substrate, and wherein the first gate insulating pattern includes a first_1 gate insulating pattern between a top surface of the second boundary liner layer and a bottom surface of the first high dielectric layer, and a first_2 gate insulating pattern between a top surface of the core region and a bottom surface of the first high dielectric layer.

According to another embodiment of the inventive concept, there is provided a semiconductor memory device comprising, a substrate including a cell region, a core region, and a boundary region between the cell region and the core region, a boundary element isolation layer in the boundary region, a first gate structure on the core region and at least a part of the boundary element isolation layer, a core element isolation layer in the core region, the core element isolation layer being in a core element isolation recess and including first and second core liner layers extending along a boundary of the core element isolation recess, and a second gate structure on the core region and at least a part of the core element isolation layer, wherein the first gate structure includes a first high dielectric layer and a first gate insulating pattern below the first high dielectric layer with a top surface of the substrate being a base reference level, the second gate structure includes a second high dielectric layer and a second gate insulating pattern below the second high dielectric layer with the top surface of the substrate being the base reference level, and wherein the second gate insulating pattern does not overlap a top surface of the first core liner layer, and overlaps a top surface of the second core liner layer and a top surface of the core region in a direction perpendicular to the top surface of the substrate.

According to another aspect of the present disclosure, there is provided a semiconductor memory device comprising, a substrate including a cell region, a core region, and a boundary region between the cell region and the core region, a boundary element isolation layer in the boundary region, the boundary element isolation layer being in a boundary element isolation recess and including first and second boundary liner layers extending along a boundary of the boundary element isolation recess, a first gate structure on the core region and at least a part of the boundary element isolation layer and a second gate structure on the core region, wherein the first gate structure includes a first high dielectric layer and a first gate insulating pattern below the first high dielectric layer with a top surface of the substrate being a base reference level, wherein the second gate structure includes a channel layer containing silicon germanium and a second gate insulating pattern on the channel layer, wherein the first gate insulating pattern does not overlap a top surface of the first boundary liner layer, and overlaps a top surface of the second boundary liner layer and a top surface of the core region in a direction perpendicular to the top surface of the substrate, and a thickness of the first gate insulation pattern is smaller than a thickness of the second gate insulation pattern.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
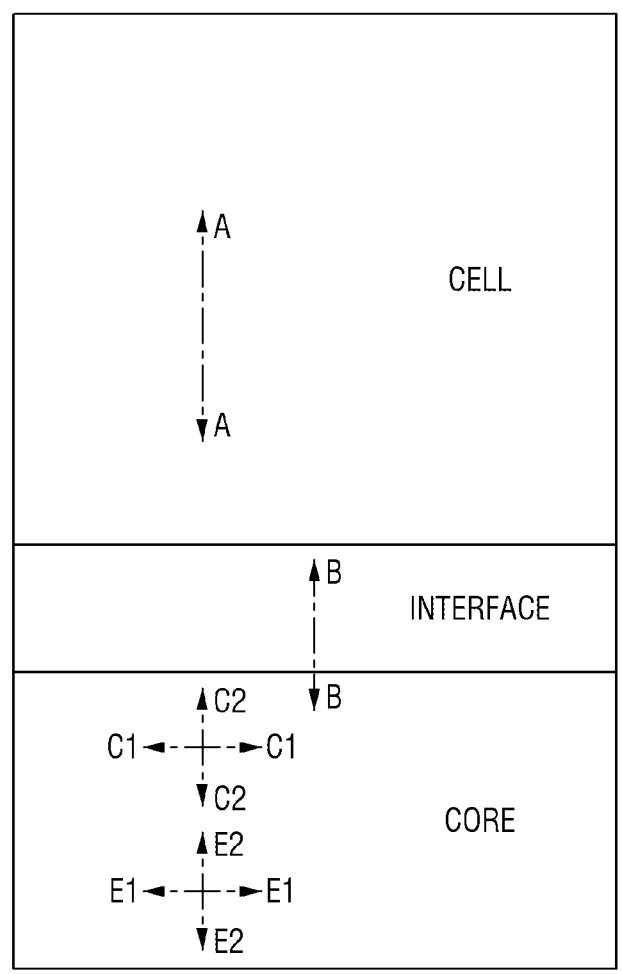
FIG. 1 is a layout diagram illustrating a semiconductor memory device according to some embodiments of the inventive concept.

Hereinafter, a semiconductor memory device according to some embodiments of the inventive concept will be described with reference to FIGS. 1 to 9A-9B.

In the drawings of the semiconductor memory device, according to some embodiments of the inventive concept, a dynamic random access memory (DRAM) is illustrated as an example, but the embodiments are not limited thereto.

FIG. 1 is a layout diagram illustrating a semiconductor memory device according to some embodiments of the inventive concept.

Referring to FIG. 1, a semiconductor memory device according to some embodiments of the inventive concept includes a cell region CELL, a core region CORE, and a boundary region INTERFACE between the cell region CELL and the core region CORE.

Semiconductor cells may be arranged to form an array in the cell region CELL. For example, when forming a semiconductor device as a semiconductor memory device, semiconductor memory cells may be arranged to form an array in the cell region CELL.

The core region CORE may be disposed around the cell region CELL or may be disposed in a separate region from the cell region CELL. Some control elements and dummy elements may be formed in the core region CORE. Accordingly, circuits used for controlling the semiconductor cells formed in the cell region CELL may be disposed in the core region CORE.

The boundary region INTERFACE may be disposed between the cell region CELL and the core region CORE. Specifically, the boundary region INTERFACE may be disposed adjacent to the cell region CELL and the core region CORE, between the cell region CELL and the core region CORE. For example, as shown in FIG. 1, the boundary region INTERFACE may be disposed between the cell region CELL and the core region CORE disposed around the cell region CELL.

A boundary element isolation layer 210 (see FIG. 4A) may be disposed in the boundary region INTERFACE. Accordingly, the boundary region INTERFACE may separate the cell region CELL from the core region CORE.

Figure 2:
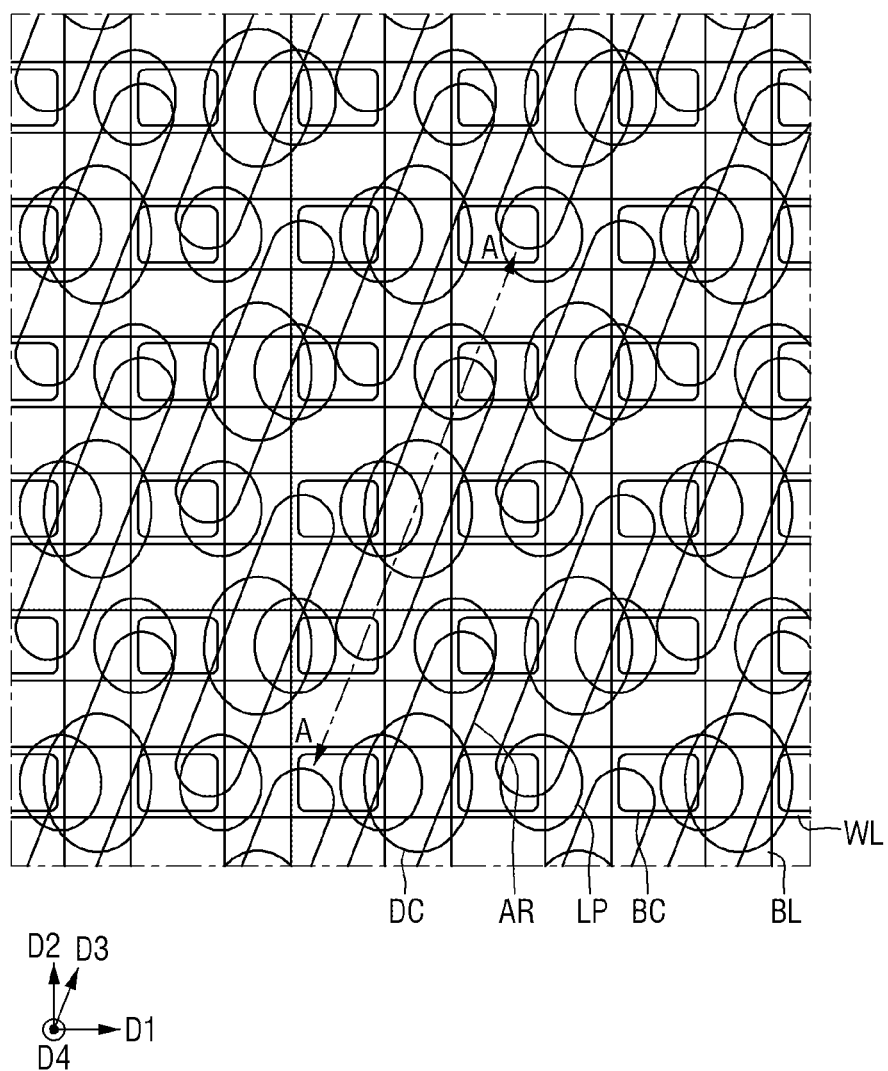
FIG. 2 is a layout diagram of a cell region of FIG. 1.
Figure 3:
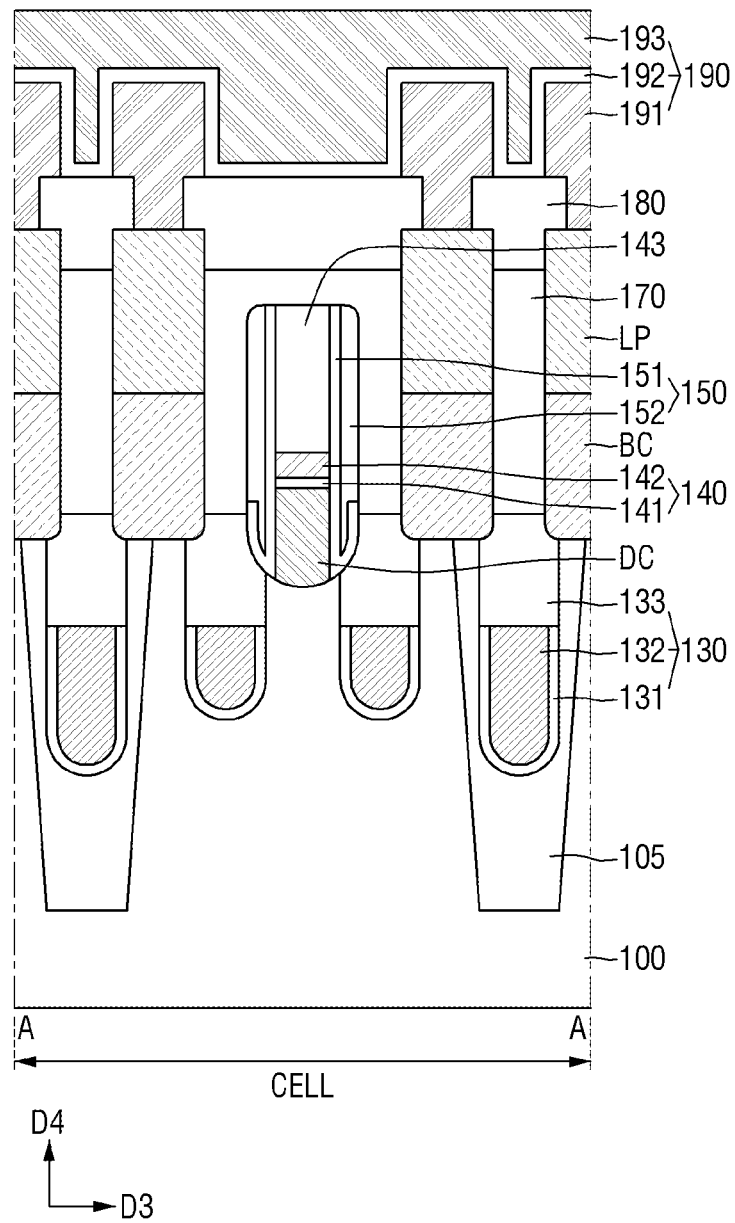
FIG. 3 is a cross-sectional view taken along line A-A of FIG. 2.

FIG. 2 is a layout diagram of a cell region of FIG. 1. FIG. 3 is a cross-sectional view taken along line A-A of FIG. 2.

Referring to FIGS. 2 and 3, the semiconductor memory device according to some embodiments may include a substrate 100, a plurality of bit lines BL, a plurality of word lines WL, direct contacts DC, buried contacts BC, and landing pads LP.

The substrate 100 may be a bulk silicon or silicon-on-insulator (SOI) substrate. In other embodiments, the substrate 100 may be a silicon substrate, or may include other materials, such as silicon germanium, silicon germanium on insulator (SGOI), indium antimonide, a lead tellurium compound, indium arsenide, indium phosphide, gallium arsenide, or gallium antimonide, but embodiments are not limited thereto. In the following description, it is assumed that the substrate 100 is a silicon substrate.

The plurality of word lines WL may extend in a first direction D1. The plurality of the word lines WL may be spaced apart from each other in a second direction D2. The word line WL may be a word line electrode 132. The word line WL may be formed by being buried in the substrate 100 of the cell region CELL. The first direction D1 and the second direction D2 may cross each other. For example, the first direction D1 and the second direction D2 may be perpendicular to each other.

The bit line BL may extend in the second direction D2. The plurality of bit lines BL may be spaced apart from each other in the first direction D1. The bit line BL may be formed on the substrate 100.

The cell region CELL portion of the substrate 100 may include cell active regions AR. As the design rule of the semiconductor memory device decreases, the cell active region AR may be formed in a shape of an oblique bar.

For example, the cell active region AR may be formed in a bar shape extending in a third direction D3, rather than in the first direction D1 and the second direction D2, on a plane in which the first direction D1 and the second direction D2 extend. The third direction D3 may cross the first direction D1. The third direction D3 may cross the second direction D2. For example, the third direction D3 may form an acute angle with the first direction D1. For example, the acute angle may be 60°, but embodiments of the inventive concept are not limited thereto.

In addition, the cell active regions AR may have a shape of a plurality of bars extending in parallel directions. In addition, one cell active region AR of the plurality of cell active regions AR may be disposed such that its center is adjacent to the end of another cell active region AR. The cell active regions AR may have a shape of a plurality of bars extending in the third direction D3. The cell active regions AR may be spaced apart from each other in the first direction D1 and in the second direction D2.

The cell active region AR may include impurities to form source and drain regions.

For example, the center of the cell active region AR may be connected to the bit line BL by the direct contact DC. Accordingly, the center of the cell active region AR may form one of the source and drain regions. In addition, for example, both ends of the cell active region AR may be connected to the buried contacts BC. Accordingly, the center of the cell active region AR may form the other one of the source and drain regions.

The cell active region AR may have a long island shape including a minor axis and a major axis. The cell active region AR may have an oblique shape to have an angle of less than 90 degrees with respect to the word line WL. In addition, the cell active region AR may have an oblique shape to have an angle of less than 90 degrees with respect to the bit line BL. That is, the cell active region AR may extend in the third direction D3 having a predetermined angle with respect to the first direction D1 and the second direction D2.

The semiconductor memory device according to some embodiments may include the substrate 100, a cell element isolation layer 105, word line structures 130, the buried contacts BC, the landing pads LP, a fence 170, an interlayer insulating layer 180, the direct contact DC, a bit line 140, a bit line spacer structure 150, and a capacitor 190.

The cell element isolation layer 105 may be formed in the substrate 100 of the cell region CELL. The cell element isolation layer 105 may have a shallow trench isolation (STI) structure having excellent element isolation characteristics. The cell element isolation layer 105 may define the plurality of cell active regions AR.

In some embodiments, the plurality of word line structures 130 may be formed by being buried in the substrate 100. The word line structures 130 may be spaced apart from each other in the third direction D3.

The word line structure 130 may include a word line insulating layer 131, the word line electrode 132 disposed on the word line insulating layer 131, and a word line capping pattern 133 disposed on the word line electrode 132.

The word line insulating layer 131 may include one or more of silicon oxide, silicon nitride, silicon oxynitride, or a high-k material having a higher dielectric constant than silicon oxide. The high-k material may include, for example, at least one material selected from the group consisting of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The word line electrode 132 may include, for example, at least one material selected from the group consisting of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof.

The word line capping pattern 133 may include, for example, at least one of polysilicon, silicon nitride (SiN), silicon oxynitride (SiON), silicon oxide (SiO$_2$), silicon carbonitride (SiCN), silicon oxycarbonitride (SiOCN), or combinations thereof.

The direct contact DC may be formed in the substrate 100 of the cell region CELL. The direct contact DC may contact the substrate 100 of the cell region CELL. For example, the direct contact DC may contact the center of the cell active region AR. The cell active region AR that is in contact with the direct contact DC in the substrate 100 of the cell region CELL may function as the source and drain regions.

The direct contact DC may include a conductive material. Accordingly, a part of the bit line 140 may be electrically connected to the cell active region AR.

In some embodiments, the direct contact DC may include polysilicon. However, embodiments of the inventive concept are not limited thereto.

The bit line 140 may include a first bit line pattern 141 and a second bit line pattern 142. The bit line 140 may be formed on the direct contact DC.

The bit line 140 may be a single layer, but as shown, the bit line 140 may be a multilayer including the first bit line pattern 141 and the second bit line pattern 142.

For example, the first bit line pattern 141 and the second bit line pattern 142 may each include polysilicon, TiN, TiSiN, tungsten, tungsten silicide, or a combination thereof. For example, the first bit line pattern 141 may include TiSiN, and the second bit line pattern 142 may include tungsten, but embodiments of the inventive concept are not limited thereto.

A bit line capping pattern 143 may be provided on the bit line 140. The bit line capping pattern 143 may include a silicon nitride layer, but embodiments of the inventive concept are not limited thereto.

The bit line spacer structure 150 may be disposed on the sidewalls of the bit line 140 and the bit line capping pattern 143. The bit line spacer structure 150 may be formed on the sidewalls of the direct contact DC, the bit line 140, and the bit line capping pattern 143.

The bit line spacer structure 150 may be a single layer in some embodiments, but as shown, the bit line spacer structure 150 may be a multilayer structure including a first bit line spacer 151 and a second bit line spacer 152. For example, the first and second bit line spacers 151 and 152 may include one of a silicon oxide layer, a silicon nitride layer, a silicon oxynitride (SiON) layer, a silicon oxycarbonitride (SiOCN) layer, air, and a combination thereof, but embodiments are not limited thereto.

The fence 170 may be formed on the cell element isolation layer 105 and the substrate 100 of the cell region CELL. The fence 170 may be formed to overlap the substrate 100 of the cell region CELL and the word line structure 130 formed in the cell element isolation layer 105.

The fence 170 may include, for example, at least one of silicon oxide, silicon nitride, silicon oxynitride, or a combination thereof, but embodiments of the inventive concept are not limited thereto. The fence 170 may separate the buried contacts BC.

The buried contact BC may physically contact the substrate 100 of the cell region CELL. For example, the buried contact BC may physically contact the end of the cell active region AR. The cell active region AR that is in physical contact with the buried contact BC in the substrate 100 of the cell region CELL may function as the source and drain regions.

The buried contact BC may include a conductive material. Accordingly, the buried contact BC may be electrically connected to the cell active region AR. The buried contact BC may include, for example, polysilicon, but embodiments of the inventive concept are not limited thereto.

The landing pad LP may be disposed on the top surface of the buried contact BC. In addition, the landing pad LP may physically contact the buried contact BC. Similarly to the buried contacts BC, the landing pads LP may form a plurality of isolated regions spaced apart from each other.

The landing pad LP may include a conductive material. Accordingly, the landing pad LP may be electrically connected to the buried contact BC. For example, the landing pad LP may include tungsten (W), but embodiments of the inventive concept are not limited thereto.

The interlayer insulating layer 180 may be formed on a part of the top surfaces of the landing pads LP. In addition, the interlayer insulating layer 180 may define a region of the landing pads LP forming the plurality of isolated regions. That is, the interlayer insulating layer 180 may separate the plurality of landing pads LP from each other. In addition, the interlayer insulating layer 180 may be patterned to expose a part of the top surface of each landing pad LP.

The interlayer insulating layer 180 may include an insulating material to electrically separate the plurality of landing pads LP from each other. For example, the interlayer insulating layer 180 may include silicon oxide, but embodiments of the inventive concept are not limited thereto.

The capacitor 190 may be disposed on the interlayer insulating layer 180 and the landing pads LP. The capacitor 190 may physically contact a part of the top surfaces of the landing pads LP exposed by the interlayer insulating layer 180. As a result, the capacitor 190 may be electrically connected to the source and drain regions connected to the buried contacts BC. Accordingly, the capacitor 190 may store electrical charge in a semiconductor memory element or the like.

For example, the capacitor 190 may include a lower electrode 191, a capacitance dielectric layer 192, and an upper electrode 193. The capacitor 190 may store electrical charge in the capacitance dielectric layer 192 due to a potential difference generated between the lower electrode 191 and the upper electrode 193.

The lower electrode 191 may include, for example, a doped semiconductor material, conductive metal nitride (e.g., titanium nitride, tantalum nitride, or tungsten nitride), metal (e.g., ruthenium, iridium, titanium, or tantalum), conductive metal oxide (e.g., iridium oxide), or the like, but embodiments of the inventive concept are not limited thereto.

The capacitance dielectric layer 192 may include, for example, a material selected from the group consisting of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof, but embodiments of the inventive concept are not limited thereto.

The upper electrode 193 may include, for example, at least one of a doped semiconductor material, a metal, conductive metal nitride, metal silicide, or a combination thereof, but embodiments of the inventive concept are not limited thereto.

The lower electrode 191 may have a cylinder shape as shown in FIG. 3. Further, although not shown, the lower electrode 191 may have a pillar shape. However, embodiments of the inventive concept are not limited thereto.

Figure 4A:
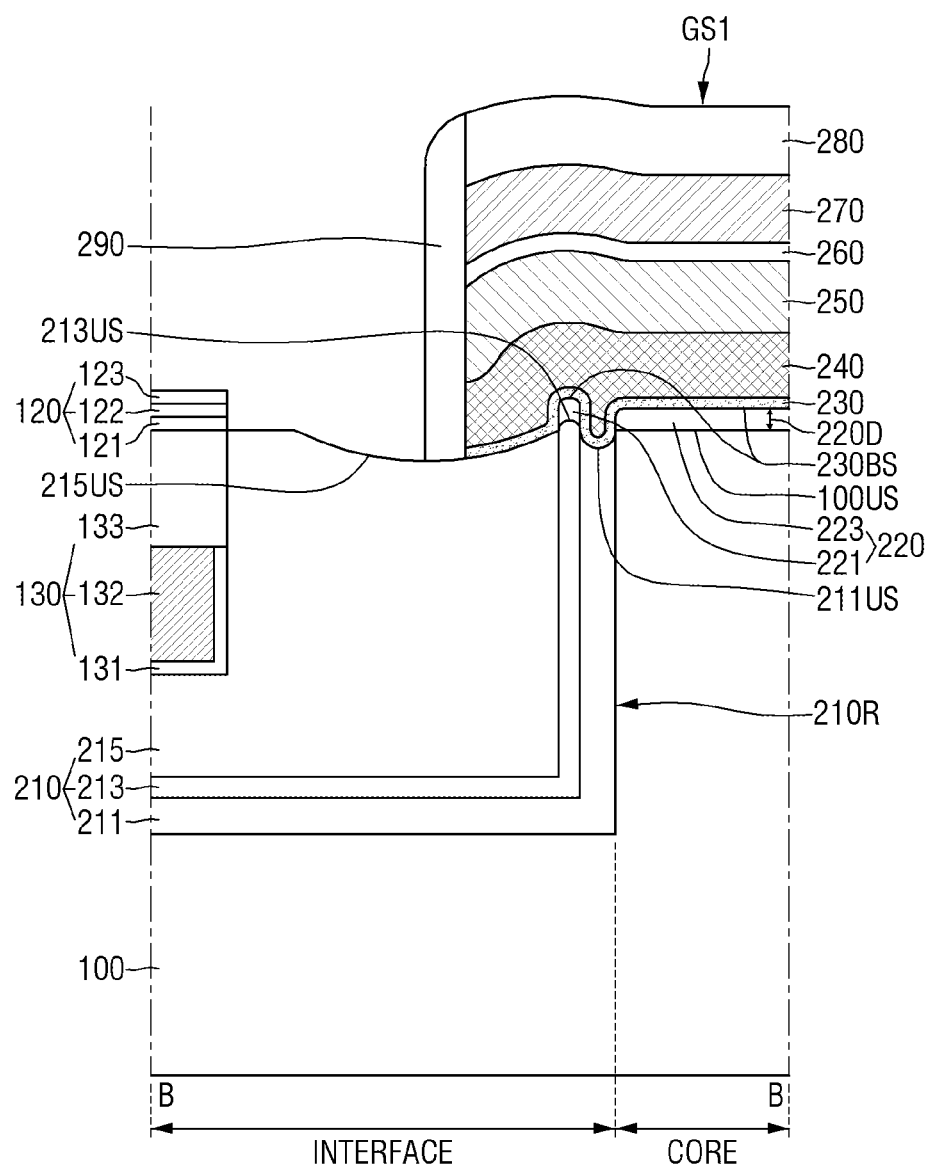
FIGS. 4A and 4B are cross-sectional views taken along line B-B of FIG. 1.
Figure 4B:
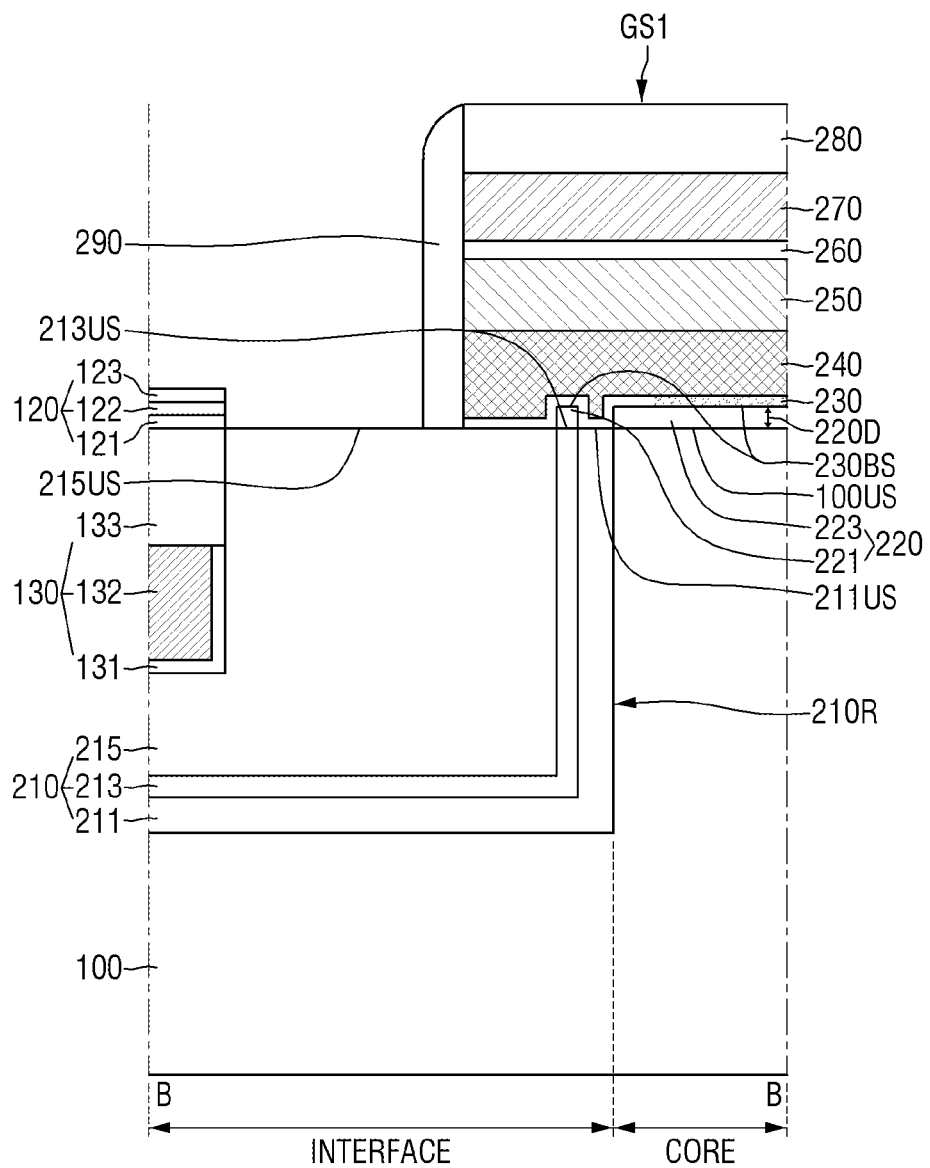

FIGS. 4A and 4B are cross-sectional views taken along line B-B of FIG. 1.

Referring to FIGS. 4A and 4B, the boundary element isolation layer 210 may be buried in the substrate 100 of the boundary region INTERFACE. The boundary element isolation layer 210 may separate the cell region CELL from the core region CORE. That is, the boundary region INTERFACE may be defined by the boundary element isolation layer 210.

In some embodiments, the boundary element isolation layer 210 may border or surround the word line structure 130. However, embodiments of the inventive concept are not limited thereto.

An insulating layer 120 may be disposed on the word line structure 130. The insulating layer 120 may be formed above the substrate 100 in the cross-sectional views of FIGS. 4A and 4B. The insulating layer 120 may be, for example, a cell buffer layer. The insulating layer 120 may be a single layer, but as shown, the insulating layer 120 may be a multilayer structure including a first insulating layer 121, a second insulating layer 122, and a third insulating layer 123.

The first insulating layer 121 may include, for example, silicon oxide. The second insulating layer 122 may include a material have an etch selectivity different from that of the first insulating layer 121. For example, the second insulating layer 122 may include silicon nitride. The third insulating layer 123 may include a material having a dielectric constant less than that of the second insulating layer 122. For example, the third insulating layer 123 may include silicon oxide.

The boundary element isolation layer 210 may include a first boundary liner layer 211 in and at least partially filling a boundary element recess 210R and disposed along the profile of the boundary element recess 210R, a second boundary liner layer 213 disposed on the first boundary liner layer 211, and a boundary element isolation filling layer 215 disposed on the second boundary liner layer 213.

As shown in FIG. 4A, the boundary element isolation filling layer 215 may include a recess. Thus, at least a part of a top surface 215US of the boundary element isolation filling layer 215 may be lower than a top surface 100US of the substrate 100 of the core region CORE in the cross-sectional view of FIG. 4A. The first boundary liner layer 211 may include a recess. Thus, at least a part of a top surface 211US of the first boundary liner layer 211 may be lower than the top surface 100US of the substrate 100 of the core region CORE in the cross-sectional view of FIG. 4A. However, embodiments of the inventive concept are not limited thereto.

As shown in FIG. 4B, the top surface 215US of the boundary element isolation filling layer 215, the top surface 100US of the substrate 100, the top surface 211US of the first boundary liner layer 211, and a top surface 213US of the second boundary liner layer 213 may lie on the same plane. In this case, the boundary element isolation filling layer 215 and the first boundary liner layer 211 may not include a recess.

The first boundary liner layer 211 may include, for example, a silicon oxide layer. The second boundary liner layer 213 may include, for example, a silicon nitride layer. The boundary element isolation filling layer 215 may include, for example, a silicon oxide layer. However, embodiments of the inventive concept are not limited thereto.

In some embodiments, a first gate structure GS1 may be disposed on the substrate 100 of the core region CORE and at least a part of the boundary element isolation layer 210.

The first gate structure GS1 may include a first gate insulating pattern 220, a first high dielectric layer 230, a first work function metal pattern 240, a first_1 gate conductive pattern 250, a first_2 gate conductive pattern 260, a first_3 gate conductive pattern 270, a first gate capping pattern 280, and a first gate spacer 290.

The first gate insulating pattern 220 may be disposed below the first high dielectric layer 230 in the cross-sectional views of FIGS. 4A and 4B. The first gate insulating pattern 220 may be disposed on the substrate 100 of the core region CORE and the boundary element isolation layer 210.

The first gate insulating pattern 220 may include a first_1 gate insulating pattern 221 disposed on the second boundary liner layer 213, and a first_2 gate insulating pattern 223 disposed on the substrate 100 of the core region CORE.

The first_1 gate insulating pattern 221 may be disposed between a bottom surface 230BS of the first high dielectric layer 230 and the top surface 213US of the second boundary liner layer 213. The first_2 gate insulating pattern 223 may be disposed between the bottom surface 230BS of the first high dielectric layer 230 and the top surface 100US of the substrate 100 of the core region CORE.

The first_1 gate insulating pattern 221 may be defined by the bottom surface 230BS of the first high dielectric layer 230 and the top surface 213US of the second boundary liner layer 213. The first_2 gate insulating pattern 223 may be defined by the bottom surface 230BS of the first high dielectric layer 230 and the top surface 100US of the substrate 100 of the core region CORE.

The first gate insulating pattern 220 may overlap in a vertical direction in the cross-sectional views of FIGS. 4A and 4B the top surface 213US of the second boundary liner layer 213 and the top surface 100US of the substrate 100 of the core region CORE. The first gate insulating pattern 220 may not overlap in a vertical direction in the cross-sectional views of FIGS. 4A and 4B the top surface 211US of the first boundary liner layer 211. The first gate insulating pattern 220 may not overlap with the boundary element isolation filling layer 215 in a vertical direction in the cross-sectional views of FIGS. 4A and 4B.

The first gate insulating pattern 220 may have a first thickness 220D between the bottom surface 230BS of the first high dielectric layer 230 and the top surface 100US of the substrate 100 of the core region CORE. The first thickness 220D may be the same as a second thickness (e.g., 320D in FIG. 6A) of a second gate insulating pattern. The first thickness 220D may be smaller than a third thickness (e.g., 420D in FIG. 8A) of a third gate insulating pattern. However, embodiments of the inventive concept are not limited thereto.

The first gate insulating pattern 220 may include, for example, a silicon oxide layer, but embodiments are not limited thereto.

The first high dielectric layer 230 may be disposed above the substrate 100 in the boundary region INTERFACE and the core region CORE. Specifically, the first high dielectric layer 230 may be disposed on at least a part of the boundary element isolation layer 210 in the boundary region INTERFACE. The first high dielectric layer 230 may be disposed on the first_1 gate insulating pattern 221 in the boundary region INTERFACE. The first high dielectric layer 230 may be disposed on the first_2 gate insulating pattern 223 in the core region CORE. The first high dielectric layer 230 may be continuously disposed from the boundary element isolation layer 210 toward the substrate 100 of the core region CORE.

The first high dielectric layer 230 may physically contact the boundary element isolation filling layer 215. The first high dielectric layer 230 may not contact the second boundary liner layer 213. The first high dielectric layer 230 may physically contact the first boundary liner layer 211. The first high dielectric layer 230 may not contact the substrate 100 of the core region CORE.

The first high dielectric layer 230 may include one or more of silicon oxide, silicon nitride, silicon oxynitride, oxide/nitride/oxide (ONO), or a high-k dielectric material having a higher dielectric constant than silicon oxide.

For example, the first high dielectric layer 230 may include hafnium oxide (HfO), hafnium silicate (HfSiO), hafnium oxide nitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxide nitride (ZrON), zirconium silicon oxide nitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), or a combination thereof, but embodiments of the inventive concept are not limited thereto.

Although not shown, an interface layer may be further interposed between the first gate insulating pattern 220 and the first high dielectric layer 230. The interface layer may reduce the likelihood of or prevent a defective interface from forming between the first gate insulating pattern 220 and the first high dielectric layer 230.

The first work function metal pattern 240 may be disposed above the substrate 100 in the boundary region INTERFACE and the core region CORE as shown in the cross-sectional views of FIGS. 4A and 4B. Specifically, the first work function metal pattern 240 may be disposed on the first high dielectric layer 230.

The first work function metal pattern 240 may include, for example, tungsten (W), tantalum (Ta), aluminum (Al), ruthenium (Ru), platinum (Pt), titanium nitride (TiN), tantalum nitride (TaN), titanium carbide (TiC), tantalum carbide (TaC), or a combination thereof, but embodiments of the inventive concept are not limited thereto.

In addition, for example, the first work function metal pattern 240 may include lanthanum (La), tantalum (Ta), tantalum nitride (TaN), niobium (Nb), titanium nitride (TiN), or a combination thereof, but embodiments of the inventive concept are not limited thereto.

In addition, the first work function metal pattern 240 may be formed in a multilayer structure in which a plurality of thin metal layers are stacked. For example, the first work function metal pattern 240 may include $Al_2O_3$/TiN, $Al_2O_3$/TaN, Al/TiN, Al/TaN, TiN/Al/TiN, TaN/Al/TaN, TiN/TiON, TaN/TiON, Ta/TiN, TaN/TiN, or a combination thereof.

The first_1 gate conductive pattern 250, the first_2 gate conductive pattern 260, and the first_3 gate conductive pattern 270 may be sequentially disposed on the first work function metal pattern 240. The first_3 gate conductive pattern 270 may be formed in the same process as the second bit line pattern 142 of FIG. 3. However, embodiments of the inventive concept are not limited thereto.

The first_1 to first_3 gate conductive patterns 250, 260, and 270 may each include polysilicon, TiN, TiSiN, tungsten, tungsten silicide, or a combination thereof. For example, the first_1 gate conductive pattern 250 may include polysilicon, the first_2 gate conductive pattern 260 may include TiSiN, and the first_3 gate conductive pattern 270 may include tungsten. However, embodiments of the inventive concept are not limited thereto.

The first gate capping pattern 280 may be disposed on the first_2 gate conductive pattern 270. The first gate capping pattern 280 may include silicon nitride, but embodiments of the inventive concept are not limited thereto.

The first gate spacer 290 may be disposed on the sidewalls of the first high dielectric layer 230, the first work function metal pattern 240, the first_1 to first_3 gate conductive patterns 250, 260, and 270, and the first gate capping pattern 280.

The first gate spacer 290 may be disposed in the boundary region INTERFACE. The first gate spacer 290 may include, for example, one of a silicon oxide layer, a silicon nitride layer, a silicon oxynitride layer (SiON), a silicon oxycarbonitride layer (SiOCN), air, and a combination thereof, but embodiments are not limited thereto.

Figure 5:
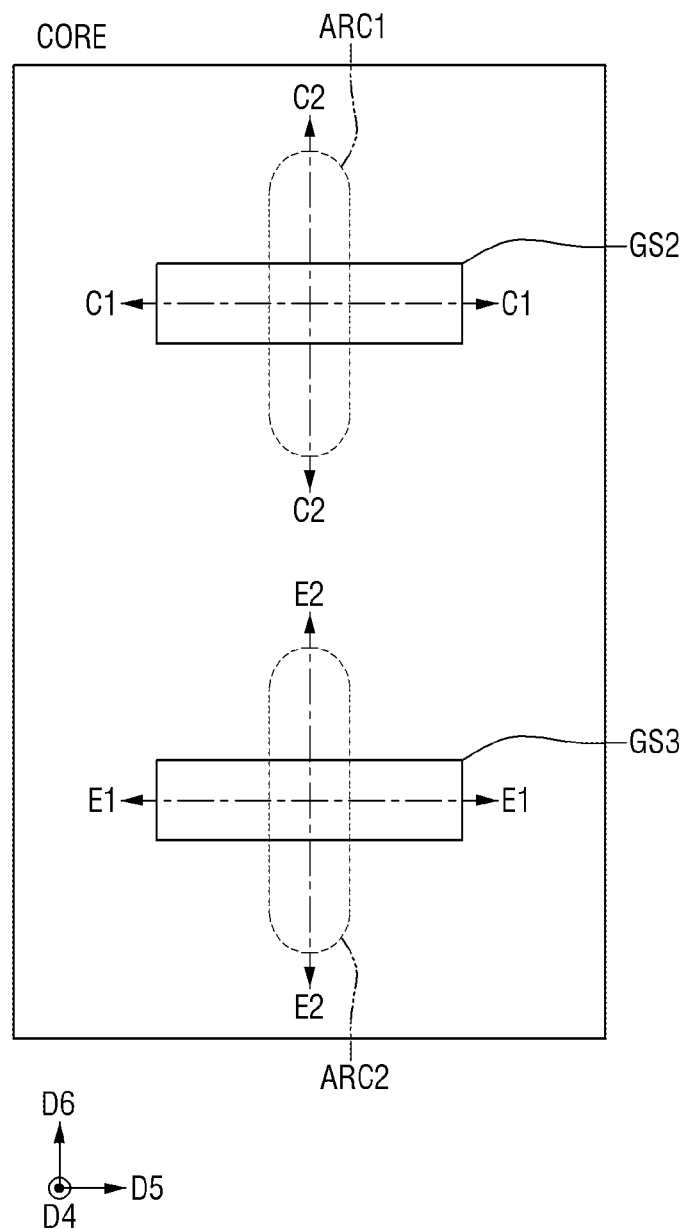
FIG. 5 is a layout diagram of a core region of FIG. 1.
Figure 6A:
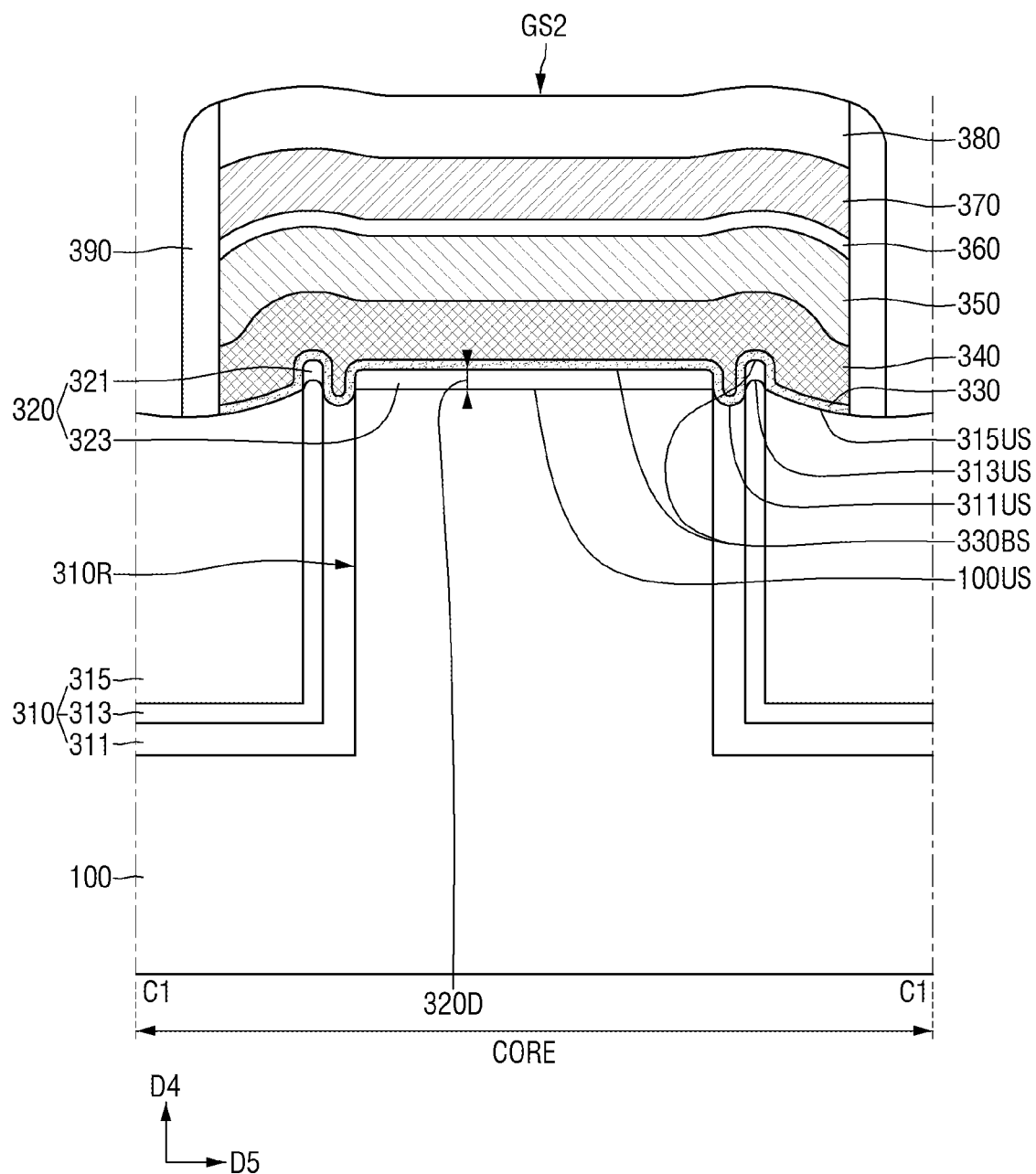
FIGS. 6A and 6B are cross-sectional views taken along line C1-C1 of FIG. 5.
Figure 6B:
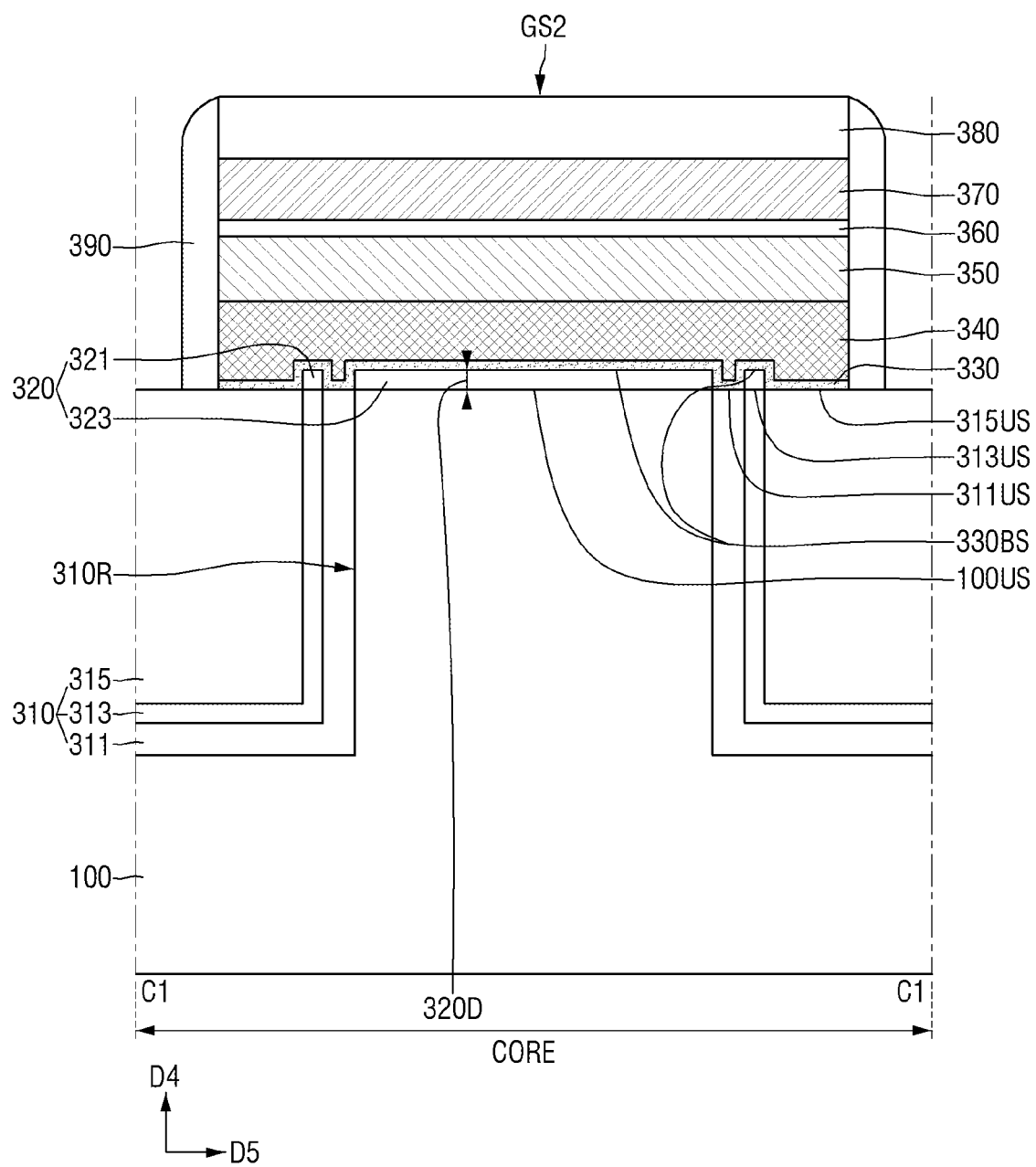
Figure 7A:
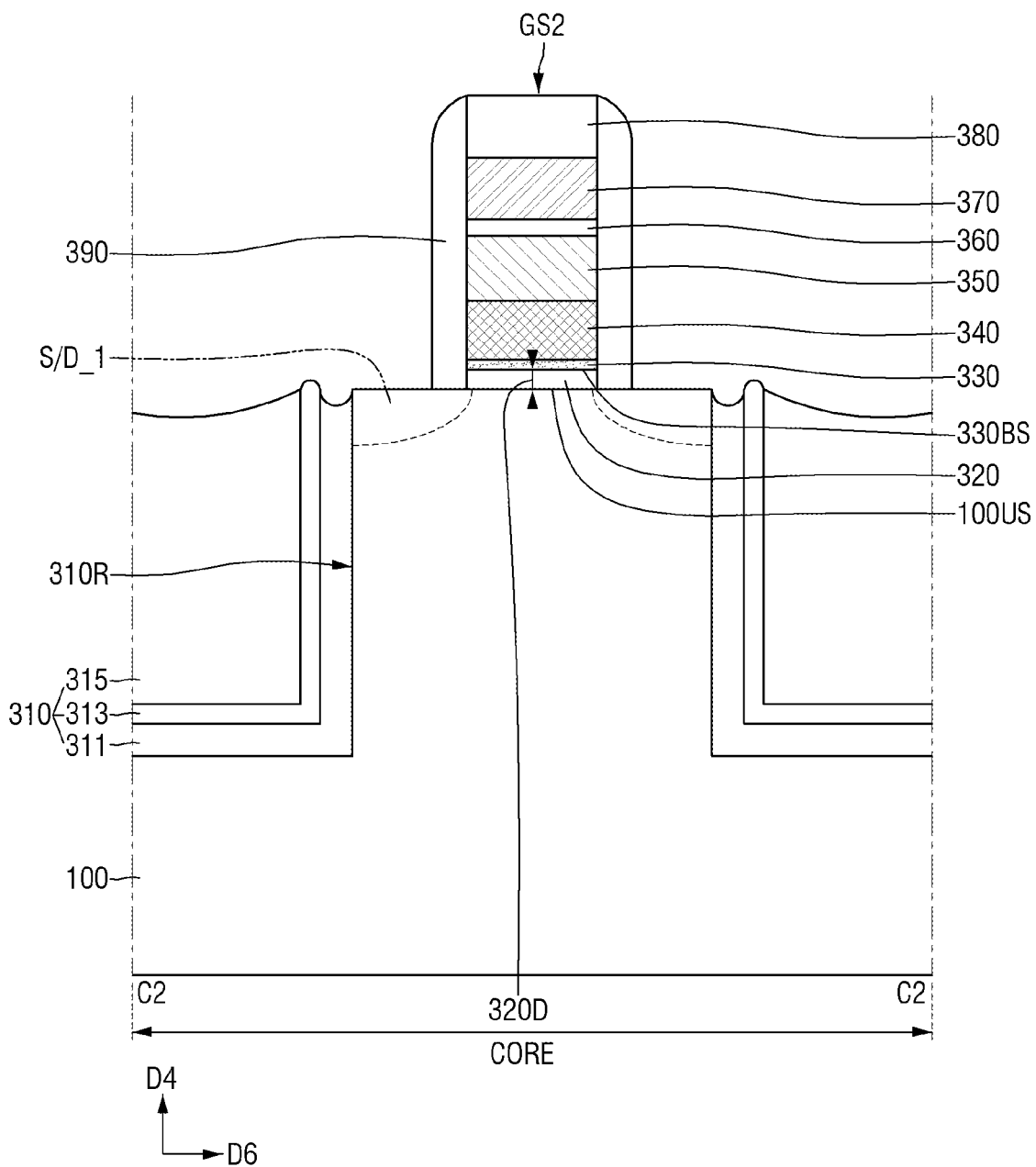
FIGS. 7A and 7B are cross-sectional views taken along line C2-C2 of FIG. 5.
Figure 7B:
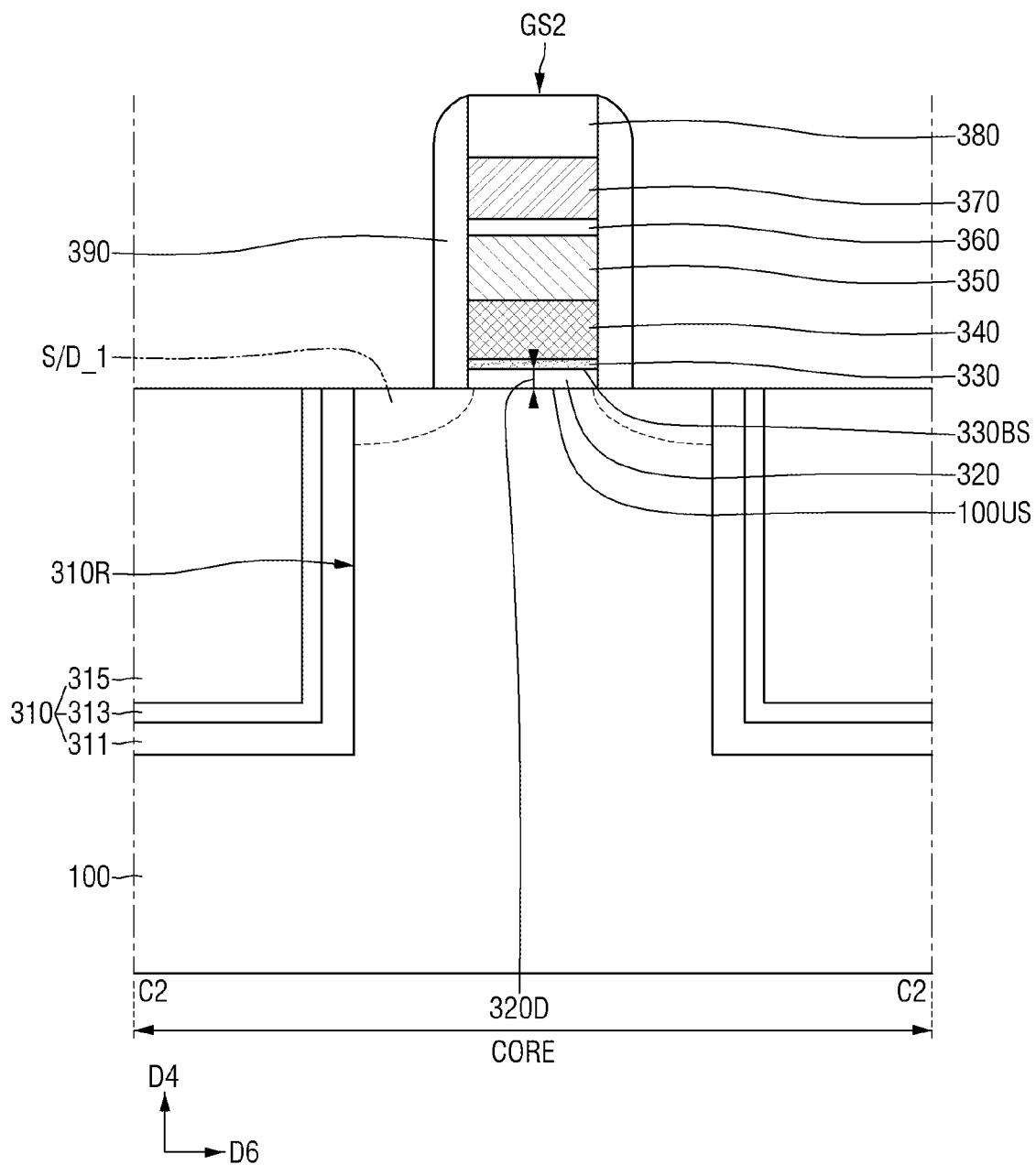

FIG. 5 is a layout diagram of a core region of FIG. 1. FIGS. 6A and 6B are cross-sectional views taken along line C1-C1 of FIG. 5. FIGS. 7A and 7B are cross-sectional views taken along line C2-C2 of FIG. 5.

A semiconductor memory device according to some embodiments will be described with reference to FIGS. 5 to 7A-7B. For simplicity of description, the following description will focus on differences from the description with reference to FIGS. 1 to 4.

Referring to FIGS. 5 to 7A-7B, the substrate 100 of the core region CORE may include a first core active region ARC1. The first core active region ARC1 may extend in a sixth direction D6.

A first core element isolation layer 310 may be buried in the substrate 100 of the core region CORE. The first core element isolation layer 310 may define the first core active region ARC1. The first core active region ARC1 may include impurities to form a first source/drain region S/D_1.

The first core element isolation layer 310 may include a first_1 core liner layer 311 formed along the profile of a first core element isolation recess 310R. The first core element isolation layer 310 may include a first_2 core liner layer 313 disposed on the first_1 core liner layer 311. In addition, the first core element isolation layer 310 may include a first core element isolation filling layer 315 that is in and at least partially fills the first core element isolation recess 310R and is disposed on the first_2 core liner layer 313.

As shown in FIG. 6A, the first core element isolation filling layer 315 may include a recess. Thus, at least a part of a top surface 315US of the first core element isolation filling layer 315 may be lower than the top surface 100US of the substrate 100 of the core region CORE. The first_1 core liner layer 311 may include a recess. Thus, at least a part of a top surface 311US of the first_1 core liner layer 311 may be lower than the top surface 100US of the substrate 100 of the core region CORE. However, embodiments of the inventive concept are not limited thereto.

As shown in FIG. 6B, the top surface 315US of the first core element isolation filling layer 315, the top surface 100US of the substrate 100, the top surface 311US of the first_1 core liner layer 311, and a top surface 313US of the first_2 core liner layer 313 may lie on the same plane. In this case, the first core element isolation filling layer 315 and the first_1 core liner layer 311 may not include a recess.

The first_1 core liner layer 311 may include, for example, a silicon oxide layer. The first_2 core liner layer 313 may include, for example, a silicon nitride layer. The first core element isolation filling layer 315 may include, for example, a silicon oxide layer. However, embodiments of the inventive concept are not limited thereto.

In some embodiments, a second gate structure GS2 may be disposed on the substrate 100 of the core region CORE. At least a part of the second gate structure GS2 may overlap the first core element isolation layer 310 in a fourth direction D4. The second gate structure GS2 may be spaced apart from the first core element isolation layer 310 in the sixth direction D6.

The second gate structure GS2 may extend in a fifth direction D5. The fifth direction D5 and the sixth direction D6 may cross each other. For example, the fifth direction D5 may be perpendicular to the sixth direction D6.

The second gate structure GS2 may be an NMOS transistor. In this case, the substrate 100 may be doped with p-type impurities. The first source/drain region S/D_1 may be doped with n-type impurities.

The second gate structure GS2 may include a second gate insulating pattern 320, a second high dielectric layer 330, a second work function metal pattern 340, a second_1 gate conductive pattern 350, a second_2 gate conductive pattern 360, a second_3 gate conductive pattern 370, a second gate capping pattern 380, and a second gate spacer 390.

The second gate insulating pattern 320 may be disposed below the second high dielectric layer 330 in the cross-sectional view of FIG. 6B. The second gate insulating pattern 320 may be disposed on the substrate 100 of the core region CORE. At least a part of the second gate insulating pattern 320 may be disposed on the first core element isolation layer 310.

The second gate insulating pattern 320 may include a second_1 gate insulating pattern 321 disposed on the first_2 core liner layer 313, and a second_2 gate insulating pattern 323 disposed on the substrate 100 of the core region CORE.

The second_1 gate insulating pattern 321 may be disposed between a bottom surface 330BS of the second high dielectric layer 330 and the top surface 313US of the second_2 core liner layer 313. The second_2 gate insulating pattern 323 may be disposed between the bottom surface 330BS of the second high dielectric layer 330 and the top surface 100US of the substrate 100 of the core region CORE.

The second_1 gate insulating pattern 321 may be defined by the bottom surface 330BS of the second high dielectric layer 330 and the top surface 313US of the second_2 core liner layer 313. The second_2 gate insulating pattern 323 may be defined by the bottom surface 330BS of the second high dielectric layer 330 and the top surface 100US of the substrate 100 of the core region CORE.

The second gate insulating pattern 320 may overlap the top surface 313US of the second_2 core liner layer 313 and the top surface 100US of the substrate 100 of the core region CORE in the fourth direction D4. The second gate insulating pattern 320 may not overlap the top surface 311US of the second_1 core liner layer 311 in the fourth direction D4. The second gate insulating pattern 320 may not overlap the first core element isolation filling layer 315 in the fourth direction D4.

The second gate insulating pattern 320 may have the second thickness 320D in the fourth direction D4 between the bottom surface 330BS of the second high dielectric layer 330 and the top surface 100US of the substrate 100 of the core region CORE. The second thickness 320D of the second gate insulating pattern 320 may be the same as the first thickness (e.g., 220D in FIG. 4A) of the first gate insulating pattern. The second thickness 320D of the second gate insulating pattern 320 may be smaller than the third thickness (e.g., 420D in FIG. 8A) of the third gate insulating pattern. The second gate insulating pattern 320 may be formed by the same process as the first gate insulating pattern (e.g., 220 in FIG. 4A). However, embodiments of the inventive concept are not limited thereto.

The second gate insulating pattern 320 may include, for example, a silicon oxide layer, but embodiments are not limited thereto.

The second high dielectric layer 330 may be disposed on the substrate 100 of the core region CORE. Specifically, the second high dielectric layer 330 may be continuously disposed on the first core element isolation layer 310 and the top surface 100US of the substrate 100 of the core region CORE.

The second high dielectric layer 330 may physically contact the first core element isolation filling layer 315. The second high dielectric layer 330 may not physically contact the first_2 core liner layer 313. The second high dielectric layer 330 may physically contact the first_1 core liner layer 311. The second high dielectric layer 330 may not physically contact the substrate 100 of the core region CORE. However, embodiments of the inventive concept are not limited thereto.

The second high dielectric layer 330 may include silicon oxide, silicon nitride, silicon oxynitride, oxide/nitride/oxide (ONO), a high-k dielectric material having a higher dielectric constant than silicon oxide, or combinations thereof.

For example, the second high dielectric layer 330 may include hafnium oxide (HfO), hafnium silicate (HfSiO), hafnium oxide nitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxide nitride (ZrON), zirconium silicon oxide nitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), or a combination thereof, but embodiments of the inventive concept are not limited thereto.

Although not shown, an interface layer may be further interposed between the second gate insulating pattern 320 and the second high dielectric layer 330. The interface layer may reduce a likelihood of or prevent a defective interface from forming between the second gate insulating pattern 320 and the second high dielectric layer 330.

The second work function metal pattern 340 may be disposed on the second high dielectric layer 330. The second work function metal pattern 340 may be a metal layer that adjusts the threshold voltage of the NMOS transistor.

The second work function metal pattern 340 may include, for example, lanthanum (La), tantalum (Ta), tantalum nitride (TaN), niobium (Nb), titanium nitride (TiN), or a combination thereof, but embodiments of the inventive concept are not limited thereto.

In addition, the second work function metal pattern 340 may be formed in a multilayer structure in which a plurality of thin metal layers are stacked. For example, the second work function metal pattern 340 may include TiN/TiON, Mg/TiN, TiN/Mg/TiN, La/TiN, TiN/La/TiN, Sr/TiN, TiN/Sr/TiN, or a combination thereof.

The second_1 gate conductive pattern 350, the second_2 gate conductive pattern 360, the second_3 gate conductive pattern 370, the second gate capping pattern 380, and the second gate spacer 390 may be formed in the same process as the first_1 gate conductive pattern 250, the first_2 gate conductive pattern 260, the first_3 gate conductive pattern 270, the first gate capping pattern 280, and the first gate spacer 290, respectively. The second_1 gate conductive pattern 350, the second_2 gate conductive pattern 360, the second_3 gate conductive pattern 370, the second gate capping pattern 380, and the second gate spacer 390 may be the same material as the first_1 gate conductive pattern 250, the first_2 gate conductive pattern 260, the first_3 gate conductive pattern 270, the first gate capping pattern 280, and the first gate spacer 290, respectively. However, embodiments of the inventive concept are not limited thereto.

Figure 8A:
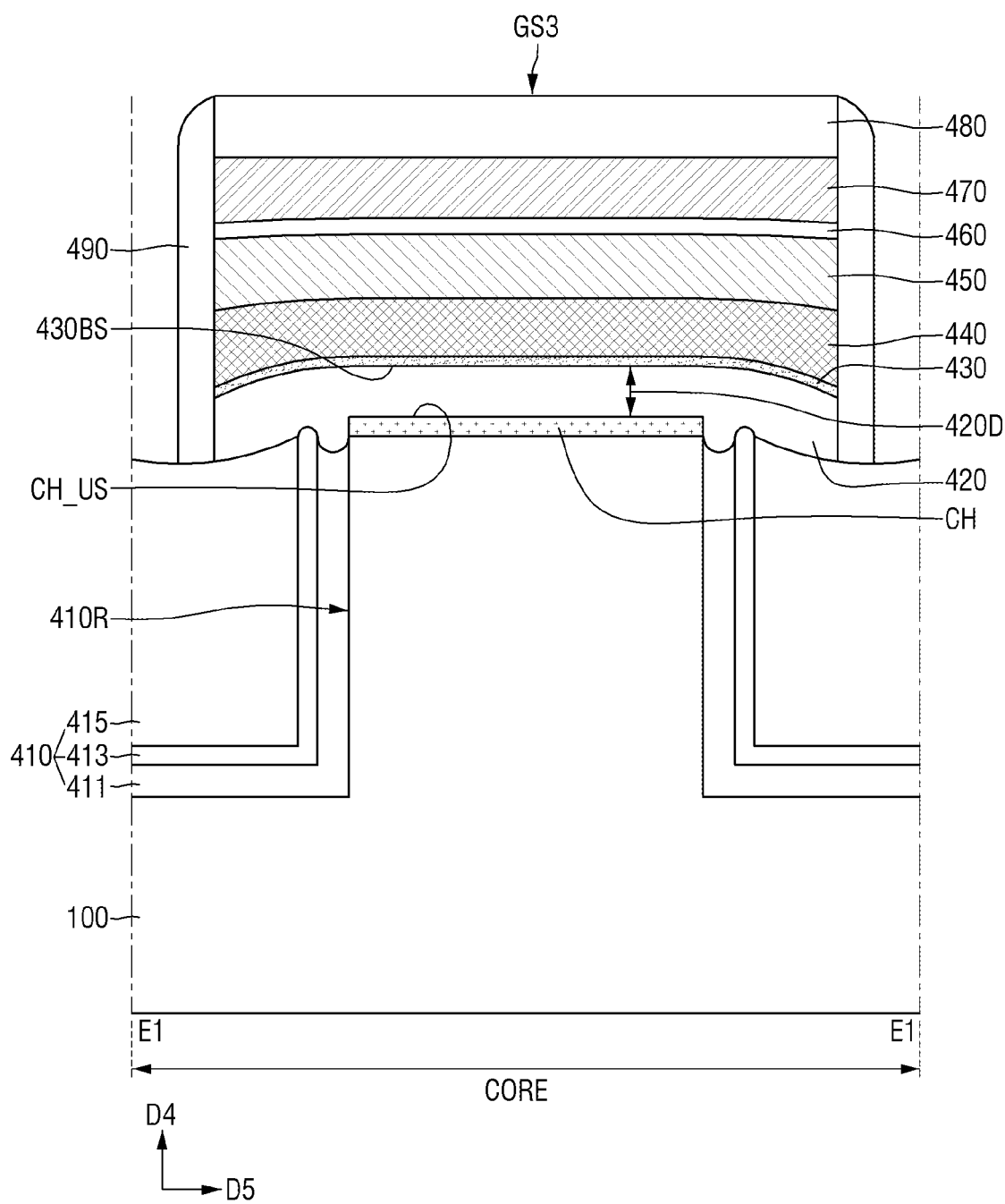
FIGS. 8A and 8B are cross-sectional views taken along line E1-E1 of FIG. 5.
Figure 8B:
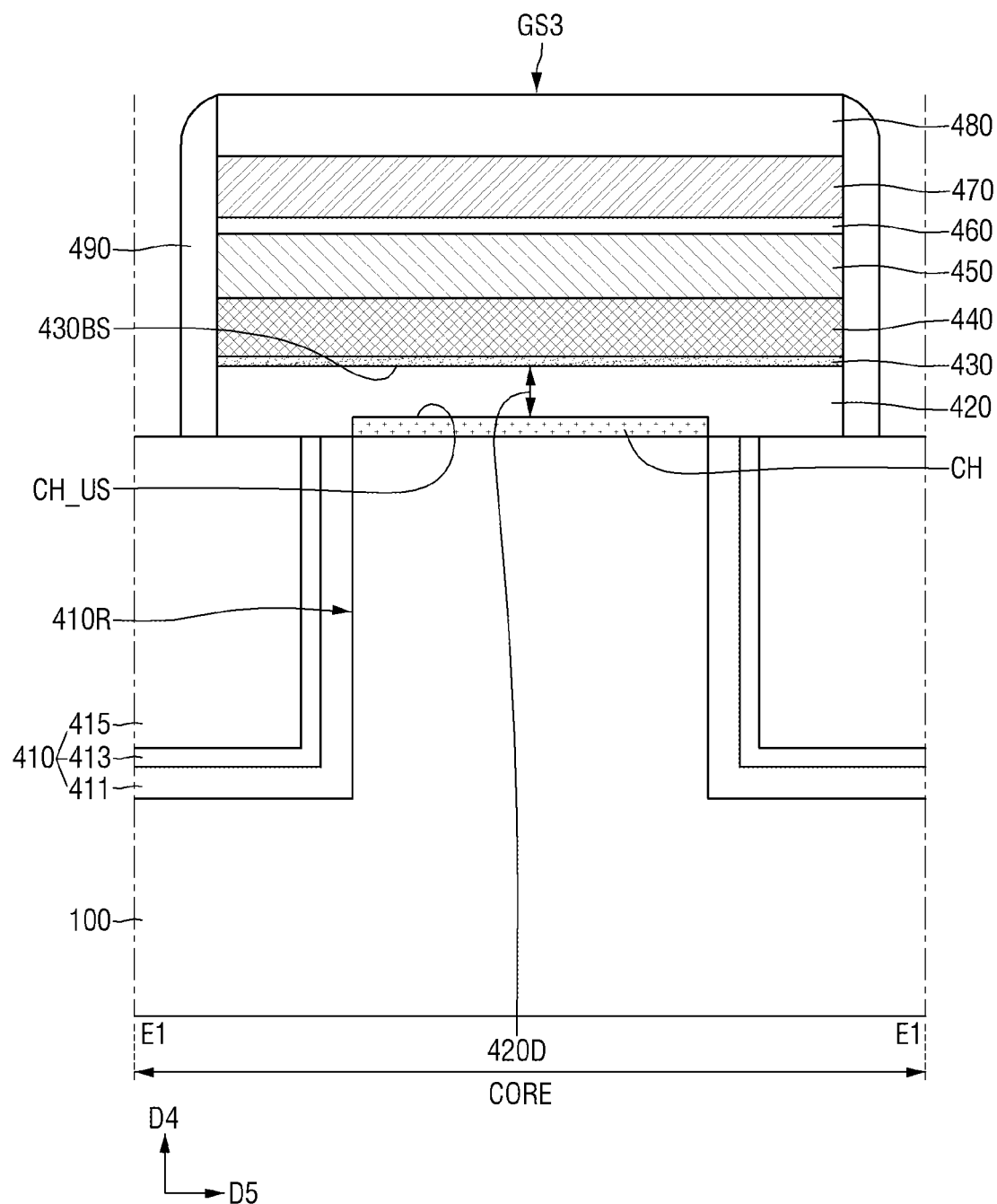
Figure 9A:
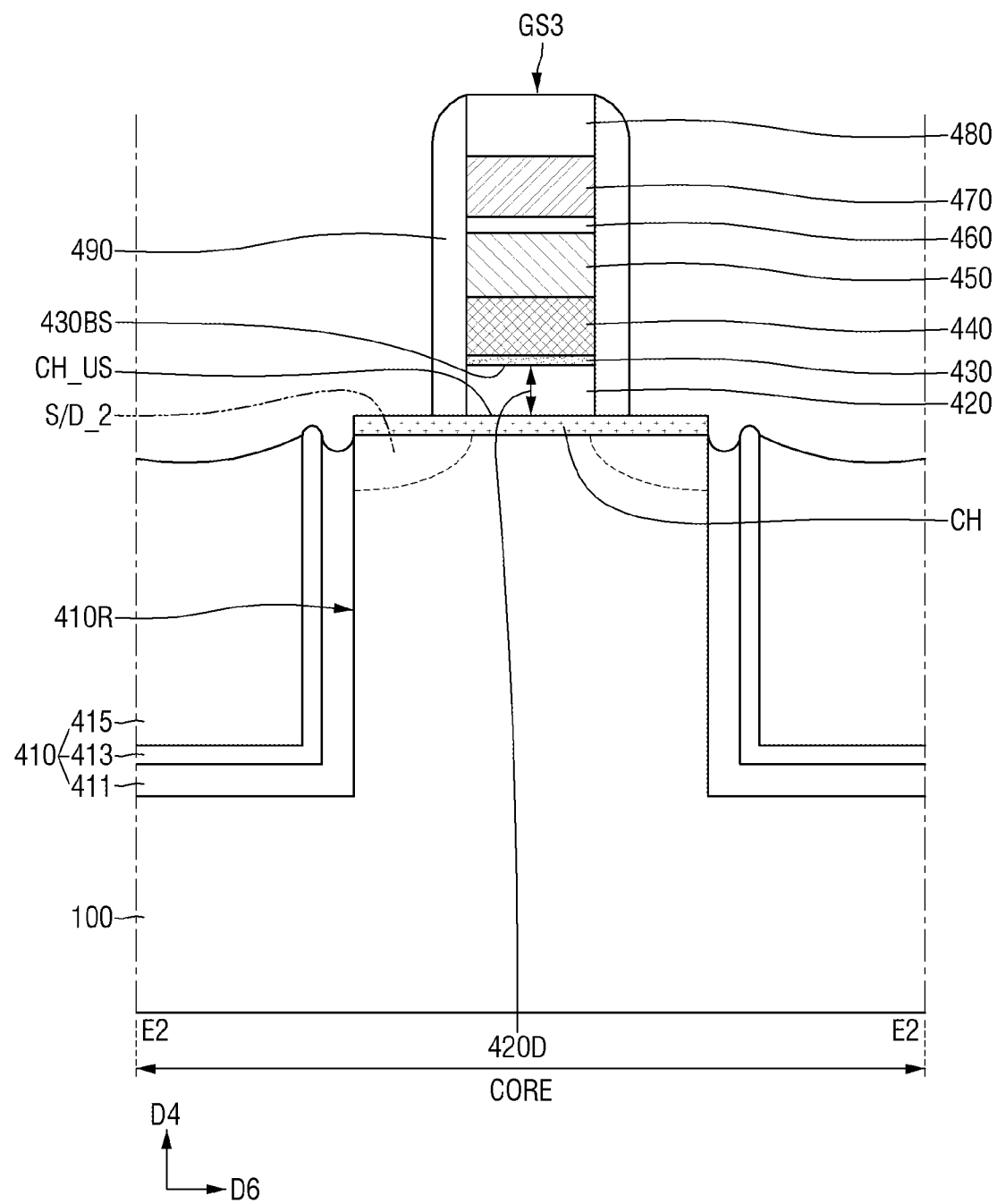
FIGS. 9A and 9B are cross-sectional views taken along line E2-E2 of FIG. 5.
Figure 9B:
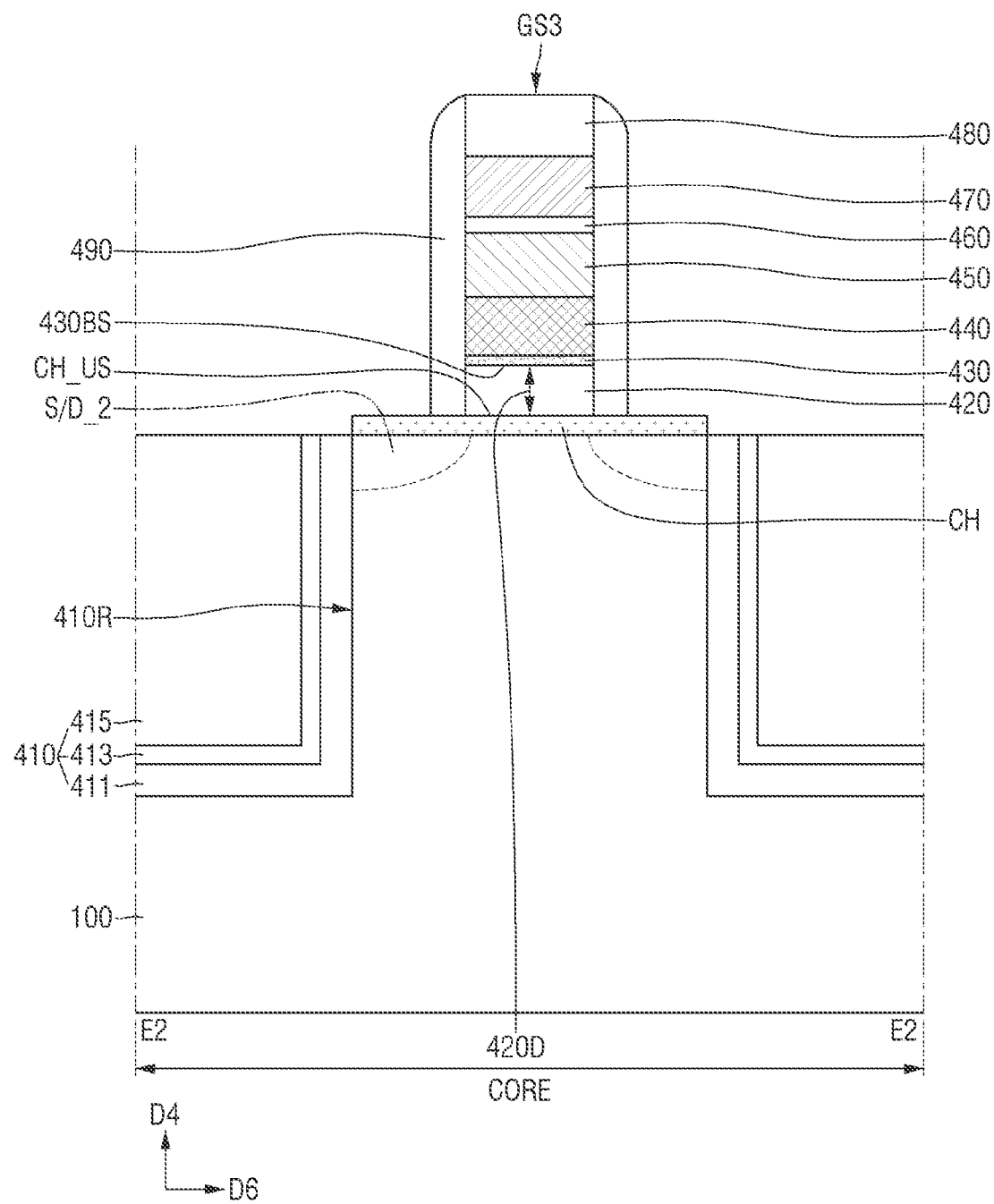

FIGS. 8A and 8B are cross-sectional views taken along line E1-E1 of FIG. 5. FIGS. 9A and 9B are cross-sectional views taken along line E2-E2 of FIG. 5.

A semiconductor memory device according to some embodiments will be described with reference to FIGS. 5 and 8A-8B to 9A-9B. For simplicity of description, the following description will focus on differences from the description with reference to FIGS. 1 to 7A-7B.

Referring to FIGS. 5 and 8A-8B to 9A-9B, the substrate 100 of the core region CORE may include a second core active region ARC2. The second core active region ARC2 may extend in the sixth direction D6.

A second core element isolation layer 410 may be buried in the substrate 100 of the core region CORE. The second core element isolation layer 410 may define the second core active region ARC2. The second core active region ARC2 may include impurities to form a second source/drain region S/D_2.

The second core element isolation layer 410 may include a second_1 core liner layer 411 formed along the profile of a second core element isolation recess 410R. The second core element isolation layer 410 may include a second_2 core liner layer 413 disposed on the second_1 core liner layer 411. In addition, the second core element isolation layer 410 may include a second core element isolation filling layer 415 that fills the second core element isolation recess 410R and is disposed on the second_2 core liner layer 413.

As shown in FIG. 8A, the second core element isolation filling layer 415 may include a recess. Thus, at least a part of the top surface of the second core element isolation filling layer 415 may be lower than the top surface of the substrate 100 in the cross-sectional view of FIG. 8A. The second_1 core liner layer 411 may include a recess. Thus, at least a part of the top surface of the second_1 core liner layer 411 may be lower than the top surface of the substrate 100 in the cross-sectional view of FIG. 8A. However, embodiments of the inventive concept are not limited thereto.

As shown in FIG. 8B, the top surface of the second core element isolation filling layer 415, the top surface of the substrate 100, the top surface of the second_1 core liner layer 411, and the top surface of the second_2 core liner layer 413 may lie on the same plane. In this case, the second core element isolation filling layer 415 and the second_1 core liner layer 411 may not include a recess.

The second_1 core liner layer 411 may include, for example, a silicon oxide layer. The second_2 core liner layer 413 may include, for example, a silicon nitride layer. The second core element isolation filling layer 415 may include, for example, a silicon oxide layer. However, embodiments of the inventive concept are not limited thereto.

In some embodiments, a third gate structure GS3 may be disposed on the substrate 100 of the core region CORE and at least a part of the second core element isolation layer 410. The third gate structure GS3 may be spaced apart from the second core element isolation layer 410 in the sixth direction D6.

The third gate structure GS3 may extend in the fifth direction D5. The fifth direction D5 and the sixth direction D6 may cross each other. For example, the fifth direction D5 may be perpendicular to the sixth direction D6.

The third gate structure GS3 may be a PMOS transistor. In this case, the substrate 100 may be doped with n-type impurities. The second source/drain region S/D_2 may be doped with p-type impurities.

The third gate structure GS3 may include a channel layer CH, a third gate insulating pattern 420, a third high dielectric layer 430, a third work function metal pattern 440, a third_1 gate conductive pattern 450, a third_2 gate conductive pattern 460, a third_3 gate conductive pattern 470, a third gate capping pattern 480, and a third gate spacer 490.

The channel layer CH may be disposed on the substrate 100 of the core region CORE. The channel layer CH may be made of silicon germanium (SiGe). When the channel layer CH is made of silicon germanium, the content of Ge in the channel layer CH may be about 10 to 50 atom %. The channel layer CH may improve hole mobility in the PMOS transistor. In addition, the channel layer CH may serve to lower the work function. The channel layer CH may be formed by a selective epitaxial growth (SEG) method.

The third gate insulating pattern 420 may be disposed on at least a part of the second core element isolation layer 410 and on the channel layer CH. The third gate insulating pattern 420 may be continuously formed on at least a part of the third core element isolation layer 410 and above the substrate 100 of the core region CORE. At least a part of the third gate insulating pattern 420 may overlap the second core element isolation layer 410 in the fourth direction D4.

The third gate insulating pattern 420 may have the third thickness 420D in the fourth direction D4 between a bottom surface 430BS of the third high dielectric layer 430 and a top surface CH US of the channel layer CH. The third thickness 420D may be greater than the second thickness (e.g., 320D in FIG. 6A) of the second gate insulating pattern and the first thickness (e.g., 220D in FIG. 4A) of the first gate insulating pattern.

The third gate insulating pattern 420 may include, for example, a silicon oxide layer, but embodiments are not limited thereto.

The third high dielectric layer 430 may be disposed on the third gate insulating pattern 420. The third high dielectric layer 430 may be substantially the same as the first high dielectric layer (e.g., 230 in FIG. 4A) and the second high dielectric layer (e.g., 330 in FIG. 6A).

Although not shown, an interface layer may be further interposed between the third gate insulating pattern 420 and the third high dielectric layer 430. The interface layer may reduce a likelihood of or prevent a defective interface from forming between the third gate insulating pattern 420 and the third high dielectric layer 430.

The third work function metal pattern 440 may be disposed on the third high dielectric layer 430. The third work function metal pattern 440 may be a metal layer that adjusts the threshold voltage of the PMOS transistor.

The third work function metal pattern 440 may include, for example, tungsten (W), tantalum (Ta), aluminum (Al), ruthenium (Ru), platinum (Pt), titanium nitride (TiN), tantalum nitride (TaN), titanium carbide (TiC), tantalum carbide (TaC), or a combination thereof, but embodiments of the inventive concept are not limited thereto.

In addition, the third work function metal pattern 440 may be formed in a multilayer structure in which a plurality of thin metal layers are stacked. For example, the third work function metal pattern 440 may include $Al_2O_3$/TiN, $Al_2O_3$/TaN, Al/TiN, Al/TaN, TiN/Al/TiN, TaN/Al/TaN, TiN/TiON, TaN/TiON, Ta/TiN, TaN/TiN, or a combination thereof.

The third_1 gate conductive pattern 450, the third_2 gate conductive pattern 460, the third_3 gate conductive pattern 470, the third gate capping pattern 480, and the third gate spacer 490 may be formed in the same process as the first_1 gate conductive pattern 250, the first_2 gate conductive pattern 260, the first_3 gate conductive pattern 270, the first gate capping pattern 280, and the first gate spacer 290, respectively. That is, the third_1 gate conductive pattern 450, the third_2 gate conductive pattern 460, the third_3 gate conductive pattern 470, the third gate capping pattern 480, and the third gate spacer 490 may be the same material as the first_1 gate conductive pattern 250, the first_2 gate conductive pattern 260, the first_3 gate conductive pattern 270, the first gate capping pattern 280, and the first gate spacer 290, respectively. However, embodiments of the inventive concept are not limited thereto.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor memory device comprising:
   a substrate including a cell region, a core region, and a boundary region between the cell region and the core region;
   a boundary element isolation layer in the boundary region, the boundary element isolation layer being in a boundary element isolation recess and including first and second boundary liner layers and a boundary element isolation filling layer; and
   a first gate structure on the core region and at least a part of the boundary element isolation layer,
   wherein the first boundary liner layer extends along a bottom surface of the boundary element isolation recess and sidewalls of the boundary element isolation recess,
   wherein the second boundary liner layer extends on the first boundary liner layer, and comprises silicon nitride,
   wherein the boundary element isolation filling layer is disposed on the second boundary liner layer,
   wherein the first gate structure includes a first high dielectric layer, and a first gate insulating pattern below the first high dielectric layer, with a top surface of the substrate being a base reference level, the first gate insulating pattern does not overlap a top surface of the first boundary liner layer in a direction perpendicular to the top surface of the substrate,
   wherein the first gate structure does not overlap the substrate of the cell region in the direction perpendicular to the top surface of the substrate,
   wherein the first gate insulating pattern includes a first_1 gate insulating pattern between a topmost surface of the second boundary liner layer and a bottom surface of the first high dielectric layer, and a first_2 gate insulating pattern between a top surface of the substrate of the core region and a bottom surface of the first high dielectric layer, and
   wherein the first_2 gate insulating pattern directly contacts the top surface of the substrate of the core region.

2. The semiconductor memory device of claim 1, wherein the first gate insulating pattern does not overlap the boundary element isolation filling layer in the direction perpendicular to the top surface of the substrate.

3. The semiconductor memory device of claim 2, wherein the first high dielectric layer is in physical contact with the boundary element isolation filling layer.

4. The semiconductor memory device of claim 1, wherein the first high dielectric layer overlaps the boundary element isolation layer and the substrate of the core region in the direction perpendicular to the top surface of the substrate.

5. The semiconductor memory device of claim 1, wherein the first high dielectric layer is in physical contact with the first boundary liner layer.

6. The semiconductor memory device of claim 1, further comprising:
   a core element isolation layer in the core region; and
   a second gate structure spaced apart from the core element isolation layer.

7. The semiconductor memory device of claim 6, wherein the second gate structure includes a second gate insulating pattern, a second high dielectric layer on the second gate insulating pattern, and a second work function metal pattern on the second high dielectric layer.

8. The semiconductor memory device of claim 1, further comprising:
   a word line structure buried in the cell region; and
   a lower electrode on the cell region.

9. A semiconductor memory device comprising:
a substrate including a cell region, a core region, and a boundary region between the cell region and the core region;
a boundary element isolation layer in the boundary region;
a first gate structure on the core region and at least a part of the boundary element isolation layer;
a core element isolation layer in the core region, the core element isolation layer being in a core element isolation recess and including first and second core liner layers and a core element isolation filling layer; and
a second gate structure on the core region and at least a part of the core element isolation layer,
wherein the first gate structure does not overlap the substrate of the cell region in a direction perpendicular to the top surface of the substrate,
wherein the first core boundary liner layer extends along a bottom surface of the element isolation recess and sidewalls of the core element isolation recess,
wherein the second core boundary liner layer on the first core boundary liner layer, and comprises silicon nitride,
wherein the core element isolation filling layer is disposed on the second boundary liner layer,
wherein the first gate structure includes a first high dielectric layer and a first gate insulating pattern below the first high dielectric layer with a top surface of the substrate being a base reference level,
wherein the second gate structure includes a second high dielectric layer and a second gate insulating pattern below the second high dielectric layer with the top surface of the substrate being the base reference level,
wherein the second gate insulating pattern does not overlap a top surface of the first core liner layer, and overlaps a topmost surface of the second core liner layer and a top surface of the substrate of the core region in the direction perpendicular to the top surface of the substrate,
wherein a portion of the first gate insulating pattern directly contacts the top surface of the substrate of the core region, and
wherein a portion of the second gate insulating pattern directly contacts the top surface of the substrate of the core region.

10. The semiconductor memory device of claim 9, wherein the first gate insulating pattern does not overlap a top surface of the first boundary liner layer, and overlaps a top surface of the second boundary liner layer and the top surface of the core region in the direction perpendicular to the top surface of the substrate.

11. The semiconductor memory device of claim 9, wherein the second gate insulating pattern does not overlap the core element isolation filling layer in the direction perpendicular to the top surface of the substrate.

12. The semiconductor memory device of claim 11, wherein the second high dielectric layer is in physical contact with the core element isolation filling layer.

13. The semiconductor memory device of claim 9, wherein the second high dielectric layer overlaps the core element isolation layer and the top surface of the substrate of the core region in the direction perpendicular to the top surface of the substrate.

14. The semiconductor memory device of claim 9, wherein the second high dielectric layer is in physical contact with the first core liner layer.

15. The semiconductor memory device of claim 9, further comprising:
a word line structure buried in the cell region; and
a lower electrode on the cell region.

16. A semiconductor memory device comprising:
a substrate including a cell region, a core region, and a boundary region between the cell region and the core region;
a boundary element isolation layer in the boundary region, the boundary element isolation layer being in a boundary element isolation recess and including first and second boundary liner layers, and a boundary element isolation filling layer;
a first gate structure on the core region and at least a part of the boundary element isolation layer; and
a second gate structure on the core region,
wherein the first gate structure does not overlap the substrate of the cell region in a direction perpendicular to the top surface of the substrate,
wherein the first boundary liner layer extends along a bottom surface of the boundary element isolation recess and sidewalls of the boundary element isolation recess,
wherein the second boundary liner layer extends on the first boundary liner layer, and comprises silicon nitride,
wherein the boundary element isolation filling layer is disposed on the second boundary liner layer,
wherein the first gate structure includes a first high dielectric layer and a first gate insulating pattern below the first high dielectric layer with a top surface of the substrate being a base reference level,
wherein the second gate structure includes a channel layer containing silicon germanium and a second gate insulating pattern on the channel layer,
wherein the first gate insulating pattern does not overlap a top surface of the first boundary liner layer, and overlaps a topmost surface of the second boundary liner layer and a top surface of the substrate of the core region in the direction perpendicular to the top surface of the substrate,
wherein a thickness of the first gate insulation pattern is smaller than a thickness of the second gate insulation pattern,
wherein a portion of the first gate insulating pattern directly contacts the top surface of the substrate of the core region, and
wherein a portion of the second gate insulating pattern directly contacts the channel layer, and the second gate insulating pattern does not contact the substrate of the core region.

17. The semiconductor memory device of claim 16,
wherein the first gate insulating pattern does not overlap the boundary element isolation filling layer in the direction perpendicular to the top surface of the substrate.

18. The semiconductor memory device of claim 17, wherein the first high dielectric layer is in physical contact with the boundary element isolation filling layer.

19. The semiconductor memory device of claim 16, wherein the first high dielectric layer is in physical contact with the first boundary liner layer.

20. The semiconductor memory device of claim 16, further comprising:
a word line structure buried in the cell region; and
a lower electrode on the cell region.

* * * * *